(12) United States Patent
Chen et al.

(10) Patent No.: US 12,501,703 B2
(45) Date of Patent: Dec. 16, 2025

(54) DISPLAY PANEL AND DISPLAY APPARATUS

(71) Applicant: Xiamen Tianma Display Technology Co., Ltd., Xiamen (CN)

(72) Inventors: Xin Chen, Wuhan (CN); Jiaxian Liu, Shanghai (CN)

(73) Assignee: Xiamen Tianma Display Technology Co., Ltd., Xiamen (CN)

( * ) Notice: Subject to any disclaimer, the term of this patent is extended or adjusted under 35 U.S.C. 154(b) by 461 days.

(21) Appl. No.: 17/583,970

(22) Filed: Jan. 25, 2022

(65) Prior Publication Data

US 2023/0093539 A1   Mar. 23, 2023

(30) Foreign Application Priority Data

Sep. 18, 2021   (CN) .......................... 202111110434.3

(51) Int. Cl.
*H10D 86/60* (2025.01)
*H10D 86/40* (2025.01)

(52) U.S. Cl.
CPC ........... *H10D 86/60* (2025.01); *H10D 86/423* (2025.01); *H10D 86/481* (2025.01)

(58) Field of Classification Search
CPC . H01L 29/42356; H01L 29/247; H01L 22/14; H01L 29/78696; H01L 29/1054; H01L 29/42384; H01L 29/7869; H01L 29/78693; H01L 29/78606
See application file for complete search history.

(56) References Cited

U.S. PATENT DOCUMENTS

| | | | | |
|---|---|---|---|---|
| 6,559,914 B1* | 5/2003 | Jones | ................ | G02F 1/136209 349/111 |
| 2012/0286260 A1* | 11/2012 | Noda | .................. | H01L 27/1222 257/43 |
| 2014/0001465 A1* | 1/2014 | Yamazaki | .............. | H10D 99/00 257/43 |
| 2015/0093853 A1* | 4/2015 | Yamazaki | ......... | H01L 21/02178 438/104 |
| 2017/0207253 A1* | 7/2017 | Liu | .................... | H01L 29/78621 |
| 2019/0148287 A1* | 5/2019 | Chang | ................. | H01L 23/5283 257/368 |
| 2019/0148558 A1* | 5/2019 | Suzuki | ................ | H01L 29/1054 257/43 |
| 2020/0152663 A1* | 5/2020 | Li | ......................... | H01L 27/124 |
| 2020/0350412 A1* | 11/2020 | Ku | ..................... | H10D 30/6755 |
| 2021/0005155 A1* | 1/2021 | Toyotaka | ............. | G09G 3/3688 |
| 2021/0057456 A1* | 2/2021 | Yan | ................... | H01L 29/66757 |
| 2022/0199830 A1* | 6/2022 | Zhang | ................ | H10D 30/6755 |
| 2022/0246736 A1* | 8/2022 | Suresha | ................ | H10D 64/01 |

(Continued)

FOREIGN PATENT DOCUMENTS

| | | |
|---|---|---|
| CN | 106158978 A | 11/2016 |
| CN | 110190066 A | 8/2019 |

*Primary Examiner* — Brian Turner
(74) *Attorney, Agent, or Firm* — Anova Law Group, PLLC

(57) ABSTRACT

A display panel and a display apparatus are provided in the present disclosure. The display panel includes a substrate and an oxide transistor disposed on a side of the substrate, where the oxide transistor includes an active layer; the active layer includes a plurality of sub-film layers which are stacked with each other; and at least two of the plurality of sub-film layers have different indium ion concentrations.

15 Claims, 12 Drawing Sheets

(56) References Cited

U.S. PATENT DOCUMENTS

2022/0278234 A1* 9/2022 Lee .................. H01L 29/51
2022/0344517 A1* 10/2022 Huang ............. H01L 29/78696
2024/0013727 A1* 1/2024 Zhang ................. G09G 3/20

* cited by examiner

DISPLAY PANEL AND DISPLAY APPARATUS

CROSS-REFERENCE TO RELATED APPLICATION

This application claims the priority of Chinese Patent Application No. 202111110434.3, filed on Sep. 18, 2021, the content of which is incorporated herein by reference in its entirety.

TECHNICAL FIELD

The present disclosure generally relates to the field of display technology and, more particularly, relates to a display panel and a display apparatus.

BACKGROUND

With the development of display technology, users have higher requirements for the yield of display panels. The display panels include a large number of transistors. If a transistor failure (not good (NG)) problem occurs during the manufacturing process of the display panels, the display panels may become defective, thereby affecting the yield of the display panels.

SUMMARY

One aspect of the present disclosure provides a display panel. The display panel includes a substrate and an oxide transistor disposed on a side of the substrate, where the oxide transistor includes an active layer; the active layer includes a plurality of sub-film layers which are stacked with each other; and at least two of the plurality of sub-film layers have different indium ion concentrations.

Another aspect of the present disclosure provides a display apparatus including a display panel. The display panel includes a substrate and an oxide transistor disposed on a side of the substrate, where the oxide transistor includes an active layer; the active layer includes a plurality of sub-film layers which are stacked with each other; and at least two of the plurality of sub-film layers have different indium ion concentrations.

Other aspects of the present disclosure can be understood by those skilled in the art in light of the description, the claims, and the drawings of the present disclosure.

BRIEF DESCRIPTION OF THE DRAWINGS

By referring to the following detailed description of non-limiting embodiments with reference to the accompanying drawings, other features, objectives and advantages of the present disclosure become more apparent, where same or similar reference signs indicate same or similar features.

DETAILED DESCRIPTION

Figure 1:
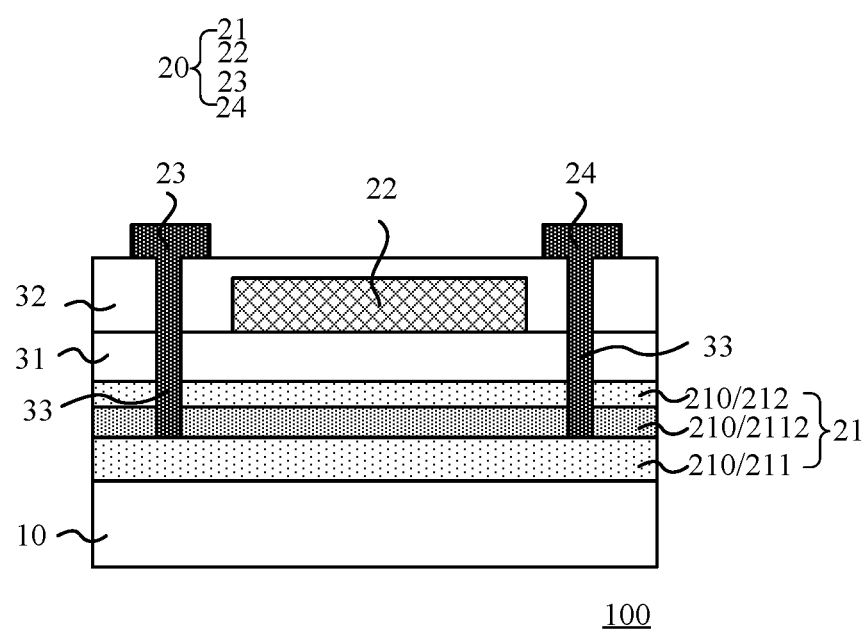
FIG. 1 illustrates a structural schematic of an exemplary display panel according to various embodiments of the present disclosure.

The features and exemplary embodiments of various aspects of the present disclosure are described in detail hereinafter. In order to make the objectives, technical solutions, and advantages of the present disclosure clearer, the present disclosure is further described in detail with reference to the accompanying drawings and embodiments hereinafter. It should be understood that embodiments described herein are only used to explain the present disclosure, and not used to limit the present disclosure. For those skilled in the art, the present disclosure can be implemented without some of these details. The following description of embodiments is only to provide a better understanding of the present disclosure by showing examples of the present disclosure.

It should be noted that in the present disclosure, relational terms such as first and second are only used to distinguish one entity or operation from another entity or operation, and do not necessarily require or imply any such actual relationship or sequence between these entities or operations.

It should be understood that when describing the structure of a component, and when a layer or region is referred to as being "on" or "above" another layer or region, the layer or region may be directly on another layer or region, or other layers or regions may be included between the layer or region and another layer or region. In addition, if the component is turned over, the layer or region may be "under" or "below" the other layer or region.

Before describing the technical solutions provided by the present disclosure, in order to facilitate the understanding of embodiments of the present disclosure, the problems in the existing technology are first described in the present disclosure.

The display panel may be normally disposed with drive circuits, such as pixel drive circuits, gate drive circuits, and the like. The pixel drive circuits may be configured to drive the light-emitting elements of the display panel to emit light, and the gate drive circuits may be configured to generate gate control signals. The drive circuit may include transistors, including oxide transistors. With the development of display technology, oxide transistors with high mobility become increasingly popular. However, for the oxide transistor with high mobility, the active layer may be easily etched through during the source-drain adjoining process, which may lead to the oxide transistor failure (NG) problem.

As the indium content contained in the active layer of the oxide transistor increases, the carrier concentration may increase, thereby increasing the mobility of the oxide transistor. However, the higher the indium content of the active layer of the oxide transistor is, the easier the conduction of the active layer is; on the contrary, the lower the indium content of the active layer is, the easier the insulation of the active layer is. In order to ensure the semiconductor performance of the active layer of the oxide transistor (that is, to prevent the active layer from being completely conductive or completely insulated), and in order to obtain high-mobility oxide transistors, it is necessary to avoid excessive indium content in the active layer. Therefore, when the indium ion concentration of the active layer is certain, the thickness of the active layer of the oxide transistor needs to be set relatively thin, for example, the thickness of the active layer of the oxide transistor may be less than 10 nm. When using vias to adjoin the source and drain electrodes to the active layer, based on the current process capability, it is easy to cause the etched vias to pass through the active layer due to the thin thickness of the active layer. As a result, the oxide transistor may have the NG problem, thereby affecting the yield of the display panel.

Embodiments of the present disclosure provide a display panel and a display apparatus, which may solve the problem that the active layer of the oxide transistor is easily etched through which results in the low yield of the display panel in the existing technology. The display panel and the display apparatus provided by embodiments of the present disclosure are described with reference to the accompanying drawings hereinafter.

The display panel provided by embodiments of the present disclosure may be an organic light-emitting diode (OLED) display panel. In other embodiments of the present disclosure, the display panel may also be a liquid crystal display panel, a micro light-emitting diode (micro LED) display panel, a quantum dot display panel, or the like, which may not be limited in the present disclosure. The display panel of embodiments of the present disclosure may be presented in various forms, and some display panel examples are described hereinafter.

As shown in FIG. 1, the display panel 100 may include a substrate 10 and an oxide transistor 20. The oxide transistor 20 may be disposed on a side of the substrate 10.

The substrate 10 may be a flexible substrate, for example, the substrate 10 may be a polyimide (PI) substrate. The substrate 10 may also be a rigid substrate, for example, the substrate 10 may be a glass substrate.

The oxide transistor 20 may include an active layer 21; and the active layer 21 may include a plurality of sub-film layers 210 which are stacked with each other. It can be understood that the plurality of sub-film layers 210 may be configured to be stacked along the direction away from the substrate 10. The number of sub-film layers 210 may be two or more than two. The number of sub-film layers 210 shown in FIG. 1 is three as an example for illustration, which may not be limited in the present disclosure. At least two of the plurality of sub-film layers 210 may have different indium (IN) ion concentrations. For example, the indium ion concentrations of three sub-film layers 210 shown in FIG. 1 may be different, where the indium ion concentration can be understood as the number of indium ions per unit volume.

Referring to FIG. 1, the oxide transistor 20 may also include a gate electrode 22, a source electrode 23, and a drain electrode 24. The display panel 100 may further include a gate insulation layer 31 and an interlayer insulation layer 32. The gate insulation layer 31 may be between the gate electrode 22 and the active layer 21; the interlayer insulation layer 32 may cover the gate electrode 22; and the source electrode 23 and the drain electrode 24 may be on the side of the interlayer insulation layer 32 away from the substrate 10. The source electrode 23 and the drain electrode 24 may be connected to the active layer 21 through vias 33, respectively. It should be understood that the orthographic projection of the gate electrode 22 on the substrate 10 may overlap the orthographic projection of the active layer 21 on the substrate 10. The source electrode 23 and the drain electrode 24 may be adjoined to the active layer 21 through the vias 33. In addition, the oxide transistor 20 is a single-gate transistor in FIG. 1. The oxide transistor 20 may also be a double-gate transistor, which may not be limited in the present disclosure.

According to the display panel provided by embodiments of the present disclosure, the active layer of the oxide transistor may not be limited to be configured as a single film layer containing only one indium ion concentration. Instead, the active layer of the oxide transistor may be divided into a plurality of sub-film layers stacked with each other, and at least two sub-film layers may have different indium ion concentrations. Compared with the single film layer containing only one indium ion concentration in the active layer, the overall thickness of the active layer may be increased while the total indium content contained in the active layer remains unchanged. In other words, in the case that the active layer may be prevented from being completely conductive and the oxide transistor may be ensured to have high mobility, the overall thickness of the active layer may be increased by dividing the active layer into sub-film layers with different indium ion concentrations. Therefore, it may prevent the etched vias connecting the source electrode and the drain electrode with the active layer from passing through the active layer, thereby avoiding the NG problem in the oxide transistor and improving the yield of the display panel.

Figure 2:
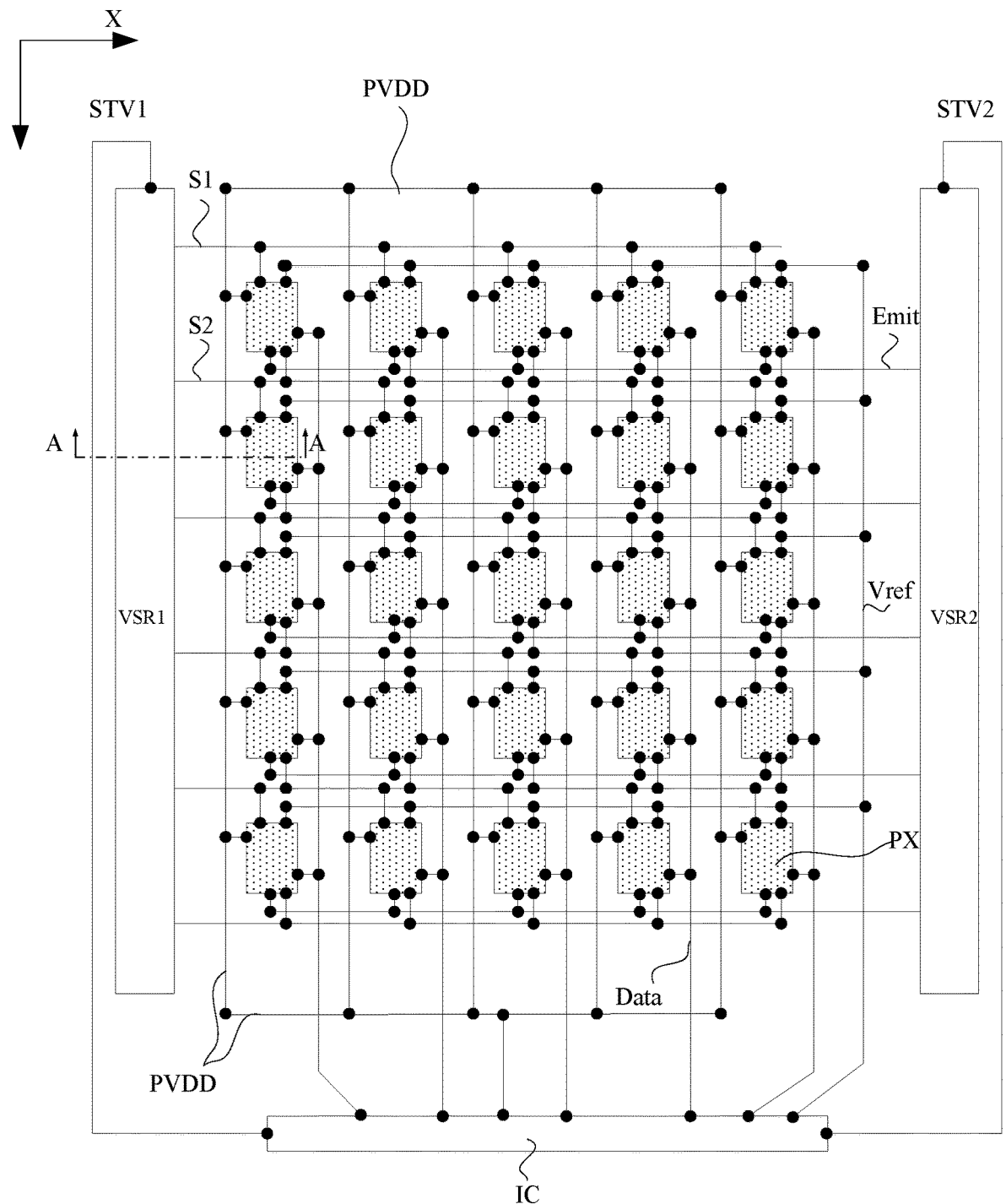
FIG. 2 illustrates a top structural view of an exemplary display panel according to various embodiments of the present disclosure.

In order to better understand the structure of the display panel provided by the embodiments as a whole, referring to FIG. 2, the display panel 100 provided by embodiments of the present disclosure may include a plurality of pixel drive circuits PX. The plurality of pixel drive circuits PX may be arranged in an array in the display region. For example, the plurality of pixel drive circuits PX may be arranged in an array along the first direction X and the second direction Y which are intersected with each other.

Exemplarily, the display panel 100 may further include a drive chip IC, a first gate drive circuit VSR1, a second gate drive circuit VSR2, a power signal line PVDD, a data signal line Data, a reference signal line Vref, a first scan signal line 051, a second scan signal line 052, a light-emitting control signal line Emit, and the like.

The first gate drive circuit VSR1 may include a plurality of cascaded shift registers; the first gate drive circuit VSR1 may be connected to the pixel drive circuit PX through the first scan signal line 051 and the second scan signal line 052; and the first gate drive circuit VSR1 may be configured to provide a scan signal to the pixel drive circuit PX. The drive chip IC may provide a first start signal STV1 to the first gate drive circuit VSR1. In addition, the scan signals transmitted by the second scan signal line 052 of a current row and the first scan signal line 051 of a next row may be same.

The second gate drive circuit VSR2 may include a plurality of cascaded shift registers; the second gate drive circuit VSR2 may be connected to the pixel drive circuit PX through the light-emitting control signal line Emit; and the second gate drive circuit VSR2 may be configured to provide a light-emitting control signal to the pixel drive circuit PX. The drive chip IC may provide a second start signal STV2 to the second gate drive circuit VSR2.

In addition, the clock signal lines (not shown in FIG. 2), the high-level signal lines (VGH, not shown in FIG. 2), and the low-level signal lines (VGL, not shown in FIG. 2) may be between the first gate drive circuit VSR1 and the drive chip IC and between the second gate drive circuit VSR2 and the drive chip IC. The drive chip IC may also provide the clock signal, the high-level signal, and the low-level signal to the first gate drive circuit VSR1 and the second gate drive circuit VSR2.

Exemplarily, the gate drive circuit capable of simultaneously generating a scan signal and a light-emitting control signal may also be configured, which may not be limited in the present disclosure.

The power signal line PVDD may be configured to provide a power voltage to the pixel drive circuit PX, and the voltage on the power signal line PVDD may be a positive voltage. The reference signal line Vref may be configured to provide a reset voltage signal, and the voltage on the reference signal line Vref may be a negative voltage.

Figure 3:
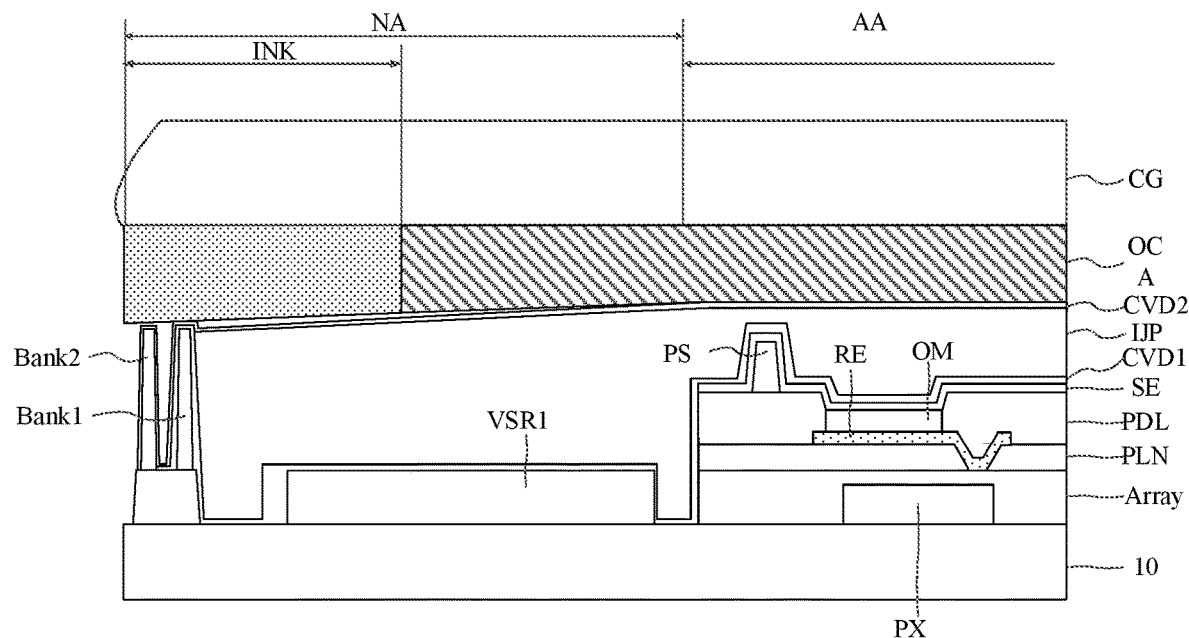
FIG. 3 illustrates a cross-sectional structural view along a A-A direction in FIG. 2.

As shown in FIG. 3, the display panel may include a display region AA and a non-display region NA; and the non-display region NA may include an ink region INK. Exemplarily, the display panel may include the substrate 10 and a drive device layer Array disposed on a side of the substrate 10. An OLED display panel may be taken as an example of the display panel. FIG. 3 also shows a planarization layer PLN, a pixel definition layer PDL, light-emitting elements (including an anode RE, an organic light-emitting layer OM, and a cathode SE), a support column PS, a thin-film encapsulation layer (including a first inorganic layer CVD1, an organic layer IJP, and a second inorganic layer CVD2), an optical adhesive layer OCA, and a cover plate CG.

Exemplarily, the display panel may further include a multiplexer circuit (Demux circuit, not shown in FIG. 3), an array substrate test circuit (AT circuit, not shown in FIG. 3), a point screen test circuit (CT circuit, not shown in FIG. 3), and the like.

At least one of the first gate drive circuit VSR1, the second gate drive circuit VSR2, the pixel drive circuit PX, the Demux circuit, the AT circuit, and the CT circuit may include the oxide transistors provided in embodiments of the present disclosure.

In some optional embodiments, the material of each sub-film layer 210 of the active layer may include indium gallium zinc oxide. In other words, the oxide transistor 20 may be made of indium gallium zinc oxide (IGZO). Obviously, the oxide transistors 20 may also be other types of transistors containing indium and oxygen.

Exemplarily, each sub-film layer of the active layer may be formed by a metal-organic chemical vapor deposition (MOCVD) method. For example, the MOCVD method may be used to adjust the gas composition to change the reaction products of each sub-film layer, such that it may ensure the film quality uniformity of the formed film with a thickness of 30 angstroms or less; and obviously, other film forming techniques may also be used to form the sub-film layers of the active layer, where 10 angstroms is equal to 1 nm.

Exemplarily, the number of sub-film layers 210 may be an odd number, such as 3, 5, 7, or the like; and the number of sub-film layers 210 may also be an even number, such as 2, 4, 6, or the like.

Exemplarily, the total thickness of the plurality of sub-film layers 210 may be greater than or equal to 10 nm to avoid the overall thickness of the active layer 21 from being relatively small. Therefore, in the case that the oxide transistor has high mobility, it may avoid the possibility that the etched vias adjoining the source electrode and the drain electrode with the active layer pass through the active layer.

In some optional embodiments, along the direction away from the substrate 10, the plurality of sub-film layers 210 may be arranged in a manner of alternating high and low indium ion concentration film layers; or along the direction away from the substrate 10, the plurality of sub-film layers 210 may be arranged in a manner of alternating low and high indium ion concentration film layers.

For example, the relationship between the indium ion concentrations of three sub-film layers 210 shown in FIG. 1 may be that the indium ion concentration of the sub-film layer 2112 located in the middle is greater than the indium ion concentrations of the sub-film layers 211 and 212 on both sides thereof. For another example, the relationship between the indium ion concentrations of two sub-film layers 210 shown in FIG. 4 may be that the indium ion concentration of the sub-film layer 213 adjacent to the substrate 10 is less than the indium ion concentration of the sub-film layer 214 away from the substrate 10.

In embodiments of the present disclosure, the sub-film layers may be arranged in a manner of alternating high and low indium ion concentration film layers or alternately arranged in a manner of low and high indium ion concentration film layers, which may better coordinate the sub-film layers with high and low indium ion concentrations, thereby better adjusting the performance of the oxide transistor.

The indium in the active layer 21 may diffuse outward over time. For example, the indium in the active layer 21 may diffuse into adjacent insulation layer, such as the gate insulation layer. Optionally, an insulation layer may also be disposed between the active layer 21 and the substrate 10. In such way, along the thickness direction of the display panel, the indium in the active layer 21 may diffuse to the insulation layers on two sides of the active layer, and the indium may undermine the insulation property of the insulation layer. The more the indium diffuses into the insulation layer, the more destructive the insulation performance of the insulation layer is. If the insulation performance of the insulation layer is undermined, its dielectric constant may also change. Furthermore, the device performance of the oxide transistor 20 may be poor, for example, the threshold voltage, mobility and the like of the oxide transistor 20 may be poor, thereby affecting the working stability of the oxide transistor 20.

In some optional embodiments, in order to reduce the indium diffusion of the active layer 21 to the insulation layer as possible, reduce the damage to the insulation layer, and ensure the working stability of the oxide transistor 20, in the case where the active layer 21 includes an odd number of sub-film layers 210, the indium ion concentrations of two sub-film layers 210 respectively located at the outermost sides of the plurality of sub-film layers 210 may be respectively less than the indium ion concentrations of the sub-film layers 210 adjacent such two sub-film layers 210. Referring to FIG. 1, still taking the active layer 21 including three sub-film layers 210 as an example, along the thickness direction of the display panel, the sub-film layer 210 with the shortest distance to the substrate 10 is the first sub-film layer 211, and the sub-film layer with the longest distance from the substrate 10 is the second sub-film layer 212. Both the first sub-film layer 211 and the second sub-film layer 212 may be adjacent to the sub-film layer 2112 located in the middle; the indium ion concentration of the first sub-film layer 211 may be less than the indium ion concentration of adjacent sub-film layer 2112 thereof; and the indium ion concentration of the second sub-film layer 212 may be less than the indium ion concentration of adjacent sub-film layer 2112 thereof. That is, the indium ion concentration of the sub-film layer 2112 located in the middle may be the highest.

In embodiments of the present disclosure, the indium ion concentrations of two sub-film layers 210 respectively located at the outermost sides may be less than the indium ion concentration of adjacent sub-film layers 210 thereof. Therefore, two sub-film layers 210 respectively located at the outermost sides may diffuse less indium to the insulation layers adjacent to two outermost sub-film layers 210, which may reduce the indium diffusion amount of the active layer 21 to the insulation layers, reduce the damage to the insulation layers, further prevent the device performance of the oxide transistor 20 from being poor, and ensure the working stability of the oxide transistor 20.

It can be understood that the less the number of sub-film layers included in the active layer is, the fewer required processing steps are. Therefore, in the case that the oxide transistor has high mobility and the etched vias adjoining the source electrode and the drain electrode with the active layer is avoided to pass through the active layer, the less the number of sub-film layers included in the active layer is, the more it is beneficial to reduce costs and improve production efficiency.

Figure 4:
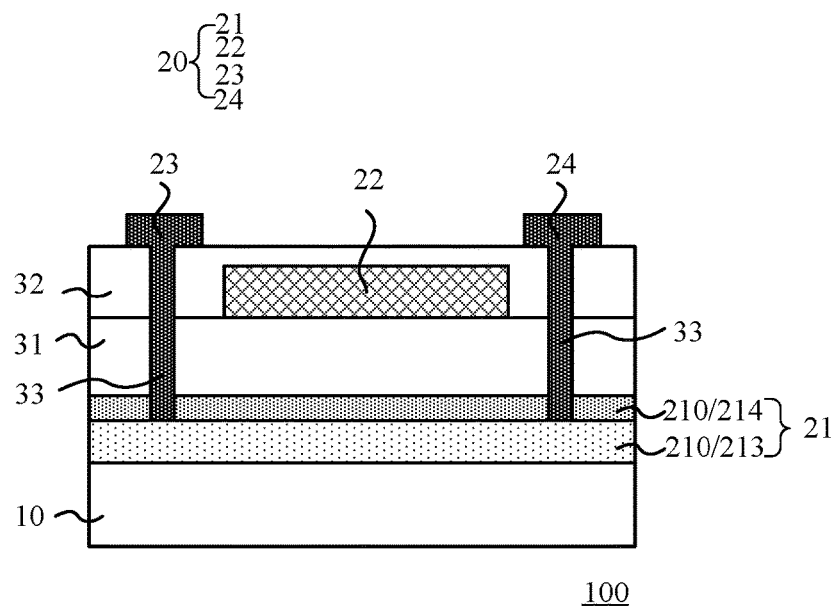
FIG. 4 illustrates another structural schematic of an exemplary display panel according to various embodiments of the present disclosure.

In some optional embodiments, in the case that the oxide transistor has high mobility and the etched vias adjoining the source electrode and the drain electrode with the active layer is avoided to pass through the active layer, the active layer may include two sub-film layers. As shown in FIG. 4, the active layer 21 may include two sub-film layers 210; the two sub-film layers 210 may be the third sub-film layer 213 and the fourth sub-film layer 214, respectively; the fourth sub-film layer 214 may be located on a side of the third sub-film layer 213 away from the substrate 10; and the indium ion concentration of the fourth sub-film layer 214 may be greater than the indium ion concentration of the third sub-film layer 213.

In embodiments of the present disclosure, on the one hand, only two sub-film layers may be disposed, which can ensure that the oxide transistor has high mobility and avoid the etched vias adjoining the source electrode and the drain electrode with the active layer to pass through the active layer. On the other hand, the indium ion concentration of the fourth sub-film layer 214 may be greater than the indium ion concentration of the third sub-film layer 213. Therefore, the carrier concentration of the fourth sub-film layer 214 may also be higher than the carrier concentration of the third sub-film layer 213; the fourth sub-film layer 214 with high carrier concentration may be located on the upper side; and the vias adjoining the source electrode and the drain electrode with the active layer may be in contact with the fourth sub-film layer 214, which may ensure desirable conductivity of the source electrode and the drain electrode.

As mentioned above, the higher the indium content in the active layer is, the easier the conduction of the active layer is. Since the indium ion concentration of the fourth sub-film layer 214 is relatively large, in order to prevent the fourth sub-film layer 214 from being completely conductive to lose its semiconductor performance, the high indium content of the fourth sub-film layer 214 may be avoided. In some optional embodiments, the thickness of the fourth sub-film layer 214 may be less than the thickness of the third sub-film layer 213. In such way, even if the indium ion concentration of the fourth sub-film layer 214 is greater than the indium ion concentration of the third sub-film layer 213, it may not cause the fourth sub-film layer 214 to be completely conductive to lose its semiconductor performance because the thickness of the fourth sub-film layer 214 is relatively small. In addition, the thickness of the third sub-film layer 213 is relatively large, which is equivalent to blocking the via etching and may prevent the vias adjoining the source electrode and the drain electrode with the active layer from passing through the active layer.

In some optional embodiments, the thickness of the fourth sub-film layer 214 may be less than 50 angstroms, and the thickness of the third sub-film layer 213 may be less than 100 angstroms. Exemplarily, the total thickness of the fourth sub-film layer 214 and the third sub-film layer 213 may be greater than or equal to 10 nm.

As described above, the indium in the active layer 21 may diffuse outward, and the indium ion concentrations of two outermost sub-film layers 210 of the plurality of sub-film layers 210 may be less than the indium ion concentrations of adjacent sub-film layers 210 thereof, such that indium diffusion in the active layer 21 to the insulation layer may be reduced as possible, and the damage to the insulation layer may be reduced. In addition, in the case that the oxide transistor has high mobility and the etched vias adjoining the source electrode and the drain electrode with the active layer is avoided to pass through the active layer, the less the number of sub-film layers included in the active layer is, the more it is beneficial to reduce costs and improve production efficiency.

Figure 5:
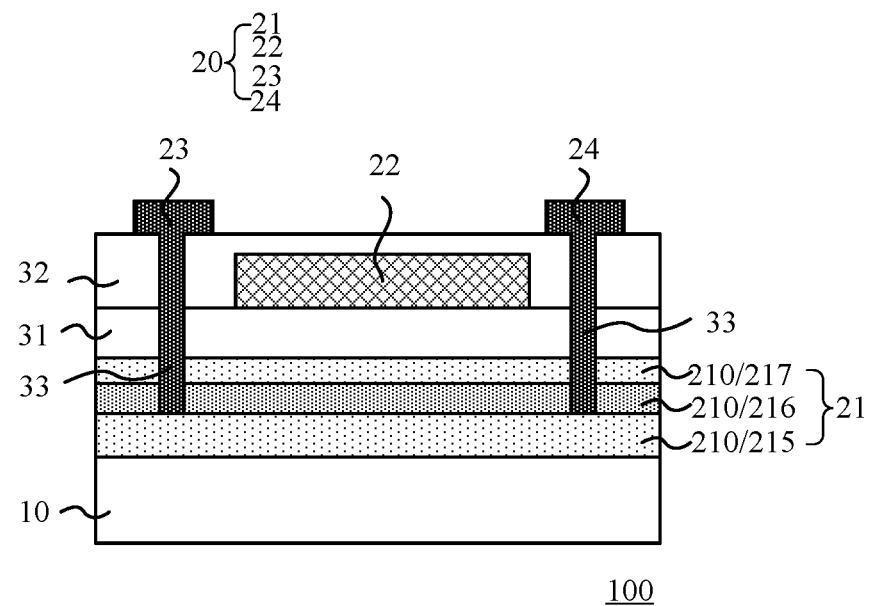
FIGS. 5-10 illustrate structural schematics of exemplary display panels according to various embodiments of the present disclosure.

In some optional embodiments, the active layer may include three sub-film layers. As shown in FIG. 5, three sub-film layers 210 may be the fifth sub-film layer 215, the sixth sub-film layer 216, and the seventh sub-film layer 217, respectively. The sixth sub-film layer 216 may be located on a side of the fifth sub-film layer 215 away from the substrate 10; the seventh sub-film layer 217 may be located on a side of the sixth sub-film layer 216 away from the substrate 10; and the indium ion concentration of the fifth sub-film layer 215 and the indium ion concentration of the seventh sub-film layer 217 may both be less than the indium ion concentration of the sixth sub-film layer 216. It can be understood that the magnitude relationship of the indium ion concentrations of the fifth sub-film layer 215, the sixth sub-film layer 216, and the seventh sub-film layer 217 is low-high-low.

In embodiments of the present disclosure, on the one hand, three sub-film layers may be arranged in order of low-high-low indium ion concentrations, such that two sub-film layers located on the outer sides may have relatively low indium ion concentrations, the indium diffusion in the active layer 21 to the insulation layer may be reduced as possible, and the damage to the insulation layer may be reduced. On the other hand, the active layer may only include three sub-film layers; and in the case that the oxide transistor has high mobility and the etched vias adjoining the source electrode and the drain electrode with the active layer is avoided to pass through the active layer, it may avoid excessive number of sub-film layers included in the active layer, thereby reducing process costs and improving production efficiency.

In some optional embodiments, the thickness of the fifth sub-film layer 215 and the thickness of the sixth sub-film layer 216 may both be greater than the thickness of the seventh sub-film layer 217. As mentioned above, the lower the indium content of the active layer is, the easier the insulation of the active layer is. The thickness of the sixth sub-film layer 216 with a relatively large indium ion concentration may be configured to be greater than the thickness of the seventh sub-film layer 217. Therefore, the indium content of the entire active layer may be prevented from being relatively low, and the active layer may be prevented from being insulated. In addition, the thickness of the fifth sub-film layer 215 is relatively large, which is equivalent to blocking the via etching and may prevent the vias adjoining the source electrode and the drain electrode with the active layer from passing through the active layer.

In some optional embodiments, the thickness of the fifth sub-film layer 215 may be less than 100 angstroms, the thickness of the sixth sub-film layer 216 may be less than 50 angstroms, and the thickness of the seventh sub-film layer 217 may be between 10 angstroms and 30 angstroms. Exemplarily, the total thickness of the fifth sub-film layer 215, the sixth sub-film layer 216, and the seventh sub-film layer 217 may be greater than or equal to 10 nm.

In some optional embodiments, referring to FIG. 5, the display panel including the gate insulation layer 31 and the interlayer insulation layer 32 and the oxide transistor 20 further including the gate electrode 22, the source electrode 23, and the drain electrode 24 may still be taken as an example for illustration. The gate insulation layer 31 may be located on a side of the active layer 21 away from the substrate 10; the gate electrode 22 may be located on a side of the gate insulation layer 31 away from the substrate 10; the interlayer insulation layer 32 may cover the gate electrode 22; and the source electrode 23 and the drain electrode 24 may be located on a side of the interlayer insulation layer 32 away from the substrate 10. The source electrode 23 and the drain electrode 24 may be respectively connected to the active layer 21 through vias 33; and the vias 33 may pass through the seventh sub-film layer 217 and the sixth sub-film layer 216 and extend to the fifth sub-film layer 215. In such way, the vias 33 must be in contact with the sixth sub-film layer 216 with a relatively high indium ion concentration. The higher the indium ion concentration is, the higher the carrier concentration is. Therefore, when the vias 33 are in contact with the sixth sub-film layer 216, it may ensure that the source electrode 23 and the drain electrode 24 have desirable conductivity. In addition, the vias 33 may not pass through the fifth sub-film layer 215, which may ensure that the etched vias are avoided to pass through the active layer, and the NG problem of the oxide transistor is prevented, thereby further improving the yield of the display panel.

Exemplarily, the via 33 may extend to a side surface of the fifth sub-film layer 215 away from the substrate 10, or the via 33 may extend to the inside of the fifth sub-film layer 215. In other words, the via 33 may have a certain depth inside the fifth sub-film layer 215.

Figure 6:
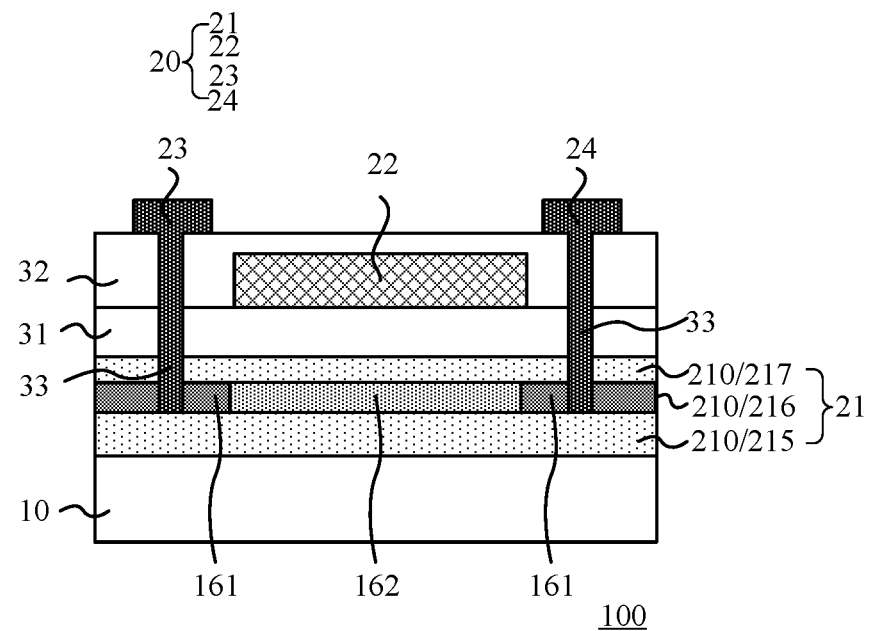

In some optional embodiments, as shown in FIG. 6, the sixth sub-film layer 216 may include source-drain adjoining regions 161 and a non-adjoining region 162; and the indium ion concentration in the source-drain adjoining region 161 may be greater than the indium ion concentration in the non-adjoining region 162. It should be understood that the source-drain adjoining regions 161 may be adjoined with the source electrode 23 and the drain electrode 24, and the non-adjoining region 162 may not need to be adjoined with the source electrode 23 and the drain electrode 24. Exemplarily, the number of source-drain adjoining regions 161 may be two. One of the source-drain adjoining regions 161 may be connected to the source electrode 23 through the via 33, and the other source-drain adjoining region 161 may be connected to the drain electrode 24 through the via 33. The orthographic projection of the via 33 on the substrate 10 may overlap the orthographic projection of the source-drain adjoining region 161 on the substrate 10; and the orthographic projection of the via 33 on the substrate 10 may not overlap the orthographic projection of the non-adjoining region 162 on the substrate 10.

The higher the indium ion concentration is, the higher the carrier concentration is. The sixth sub-film layer 216 may be divided into the source-drain adjoining region 161 with high indium ion concentration and the non-adjoining region 162 with low indium ion concentration, such that the source electrode 23 and the drain electrode 24 may be adjoined with the source-drain adjoining region 161 with high indium ion concentration, which can further ensure desirable conductivity of the source electrode 23 and the drain electrode 24.

Figure 7:
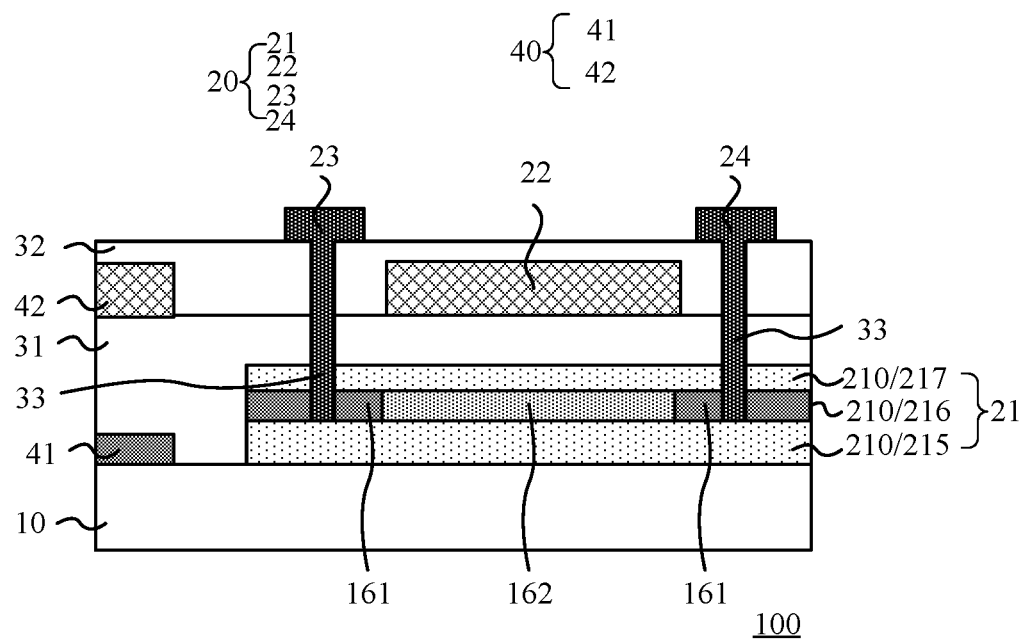

In some optional embodiments, referring to FIG. 7, the display panel 100 may include a capacitor 40. A plate 41 of the capacitor 40 may be disposed in a same layer and made of a same material as the source-drain adjoining region 161. Since the indium ion concentration in the source-drain adjoining region 161 is relatively high, the carrier concentration in the source-drain adjoining region 161 may be relatively high, and the conductivity of the source-drain adjoining region 161 may be desirable. In such way, while ensuring that the plate 41 of the capacitor 40 has desirable conductivity, the plate 41 of the capacitor 40 and the source-drain adjoining region 161 may be prepared by a same process, thereby simplifying the processing steps.

Exemplarily, the other plate 42 of the capacitor 40 may be disposed on the metal film layer of the display panel. For example, as shown in FIG. 7, exemplarily, the other plate 42 of the capacitor 40 and the gate electrode 22 may be disposed in a same layer and made with a same material, which may not be limited in the present disclosure.

Figure 8:
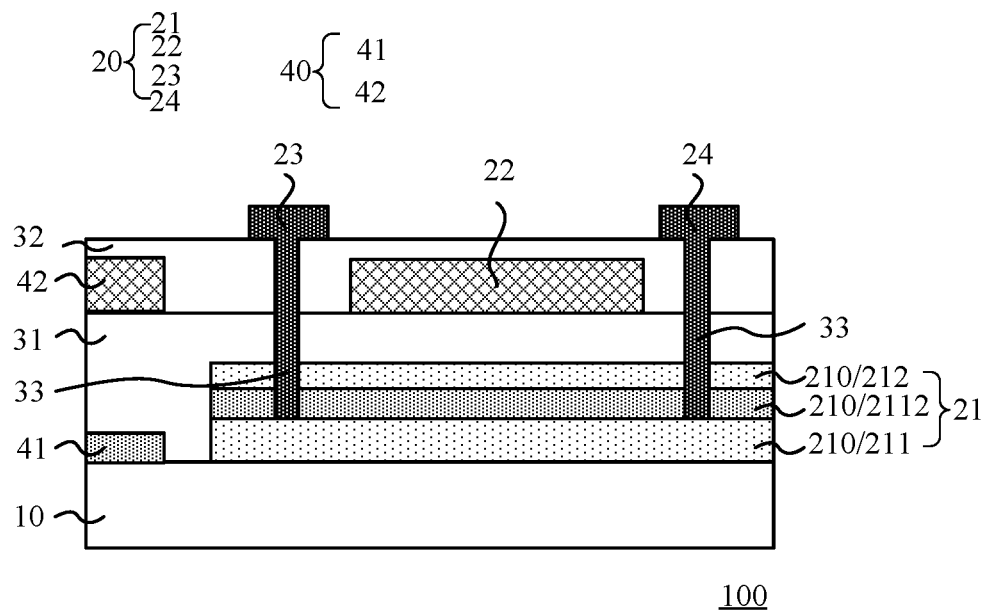

In some optional embodiments, when the indium ion concentration of each sub-film layer is uniform, one plate of the capacitor and the sub-film layer with high indium ion concentration in at least two sub-film layers may be directly configured to be in a same layer with a same material. As shown in FIG. 8, the number of sub-film layers as three is taken as an example, the sub-film layer 2112 located in the middle may have the highest indium ion concentration, and one plate 41 of the capacitor 40 and the sub-film layer 2112 may be configured to be in a same layer with a same material. Similarly, the indium ion concentration of the sub-film layer 2112 is relatively high, so that the carrier concentration of the sub-film layer 2112 may be relatively high, and the conductivity of the sub-film layer 2112 may be desirable. Therefore, while ensuring that one plate 41 of the capacitor 40 has desirable conductivity, one plate 41 and the sub-film layer 2112 of the capacitor 40 may be prepared by a same process, thereby simplifying the processing steps.

Exemplarily, the other plate 42 of the capacitor 40 may be disposed in the metal film layer of the display panel. For example, as shown in FIG. 8, exemplarily, the other plate 42 of the capacitor 40 and the gate electrode 22 may be disposed in a same layer and made with a same material, which may not be limited in the present disclosure.

Figure 9:
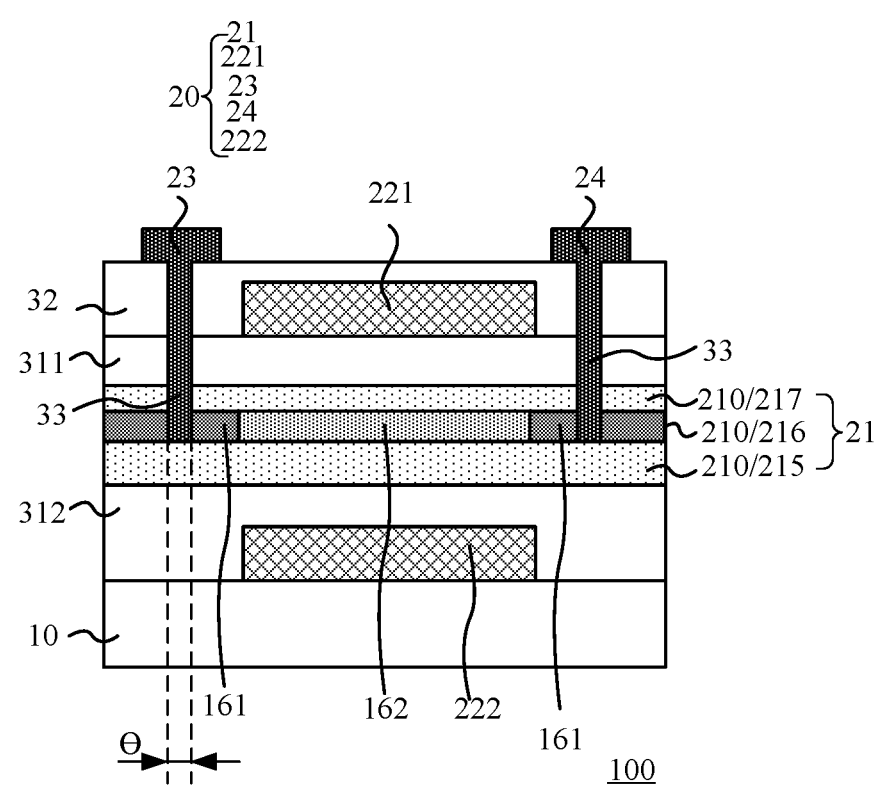

In some optional embodiments, as shown in FIG. 9, the display panel may include the first gate insulation layer 311 and the interlayer insulation layer 32; and the oxide transistor 20 may further include the first gate electrode 221, the source electrode 23 and the drain electrode 24. The first gate insulation layer 311 may be located on a side of the active layer 21 away from the substrate 10; the first gate 221 may be located on a side of the first gate insulation layer 311 away from the substrate 10; the interlayer insulation layer 32 may cover the first gate electrode 221; the source electrode 23 and the drain electrode 24 may be located on a side of the interlayer insulation layer 32 away from the substrate 10; and the source electrode 23 and the drain electrode 24 may be connected to the active layer 21 through the vias 33, respectively. Exemplarily, as shown in FIG. 9, the active layer 21 may include sub-film layers 215, 216, and 217, where the indium ion concentrations of the sub-film layers 215 and 217 may both be less than the indium ion concentration of the sub-film layer 216.

In order to prevent the via 33 from being over-etched, that is, to prevent the via 33 from being etched to pass through the entire active layer 21, the via 33 may be in a surface contact with the active layer 21, that is, the contact surface between the via 33 and the active layer 21 may be configured to be relatively large. The diameter of the via 33 is $\ominus$, where $2 \ \mu m \leq \ominus \leq 3 \ \mu m$. Exemplarily, $\ominus$ may be equal to 2 μm, 2.5 μm, 3 μm, or the like. The via 33 may be a round hole and have a certain depth, and the diameters corresponding to different depth positions may be different. Exemplarily, the minimum diameter of the via 33 may be greater than or equal to 2 μm and less than or equal to 3 μm.

Since $2 \ \mu m \leq \ominus \leq 3 \ \mu m$, the diameter of the via 33 may be configured to be relatively large, which may increase the contact area between the via 33 and the active layer 21. It can be understood that in the arrangement sequence of low-high-low indium ion concentrations as shown in FIG. 9, the contact area between the via 33 and the sub-film layer 216 may also be increased. On the one hand, it may prevent the over-etching problem of the via 33; on the other hand, it may increase the transmission area to reduce the transmission resistance, and improve the stability of signal transmission.

Exemplarily, the contact resistance between the via 33 and the active layer 21 may be less than or equal to 3000 ohms.

In the display panel provided by embodiments of the present disclosure, the oxide transistor 20 may be a double-gate transistor. Taking FIG. 9 as an example, the oxide transistor 20 may further include the second gate electrode 222, and the display panel may further include the second gate insulation layer 312. The second gate insulation layer 312 may be located on a side of the active layer 21 away from the first gate insulation layer 311, and the second gate electrode 222 may be located on a side of the second gate insulation layer 312 away from the active layer 21. In the case where the oxide transistor 20 is a double-gate transistor, the structure of each sub-film layer of the active layer 21 in FIG. 9 may only be exemplary, and may not be used to limit the structure of the oxide transistor 20.

Figure 10:
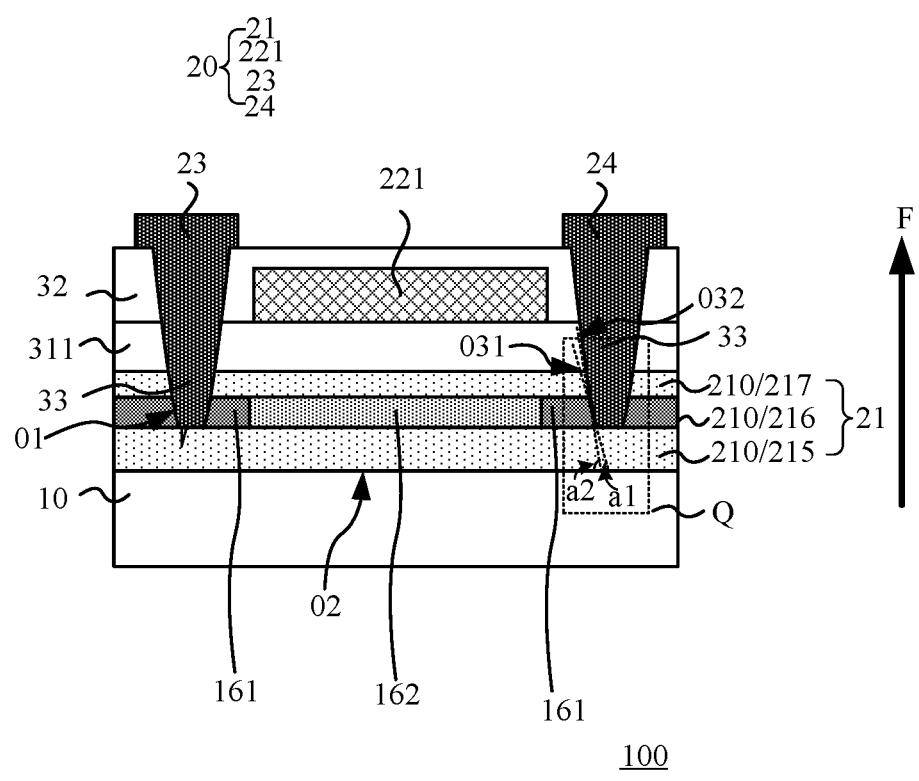
Figure 11:
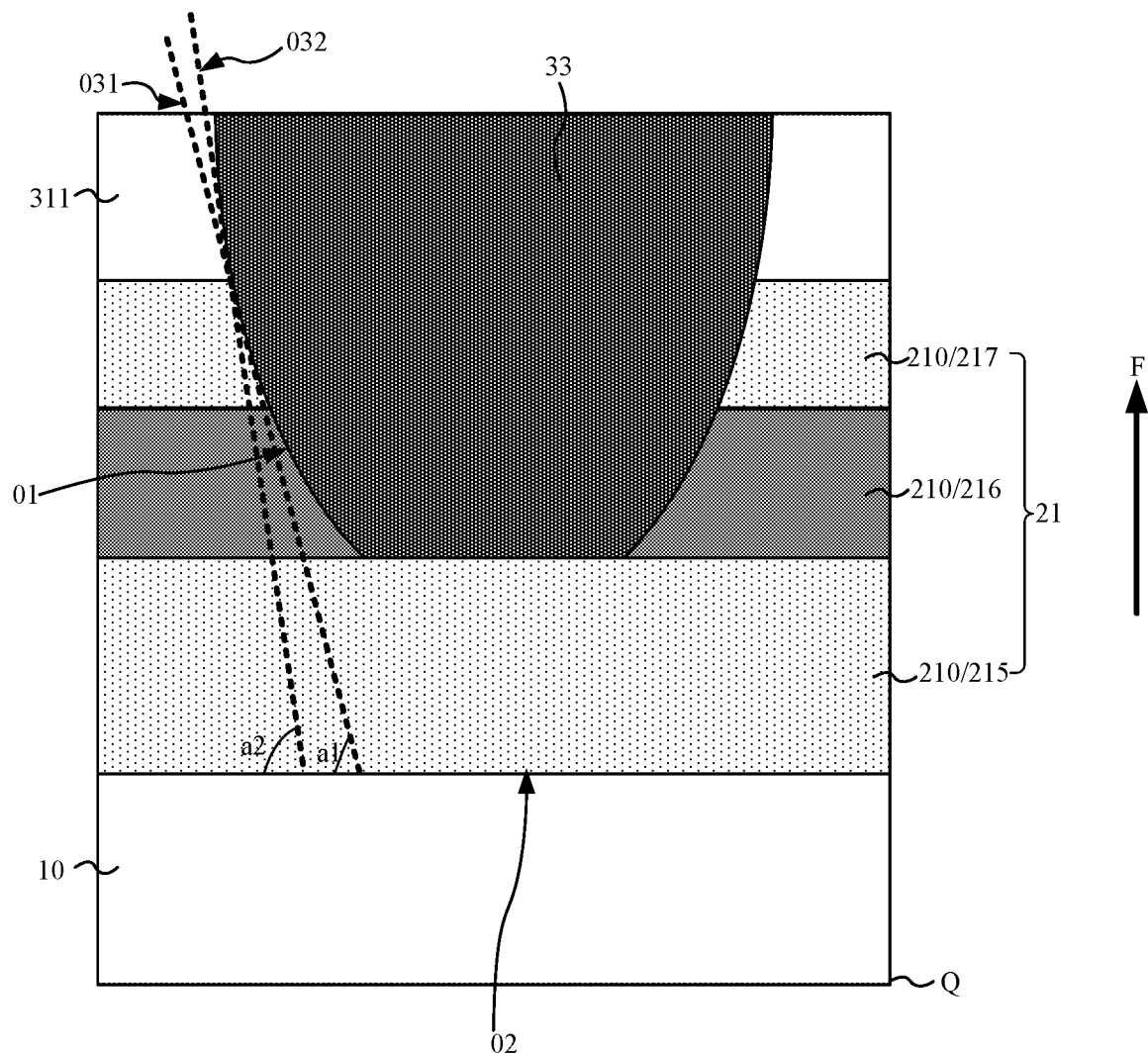
FIG. 11 illustrates an enlarged schematic of a region Q in FIG. 10.

In some optional embodiments, in order to further increase the contact area between the via 33 and the active layer 21, as shown in FIGS. 10 and 11, the surface of the active layer 21 adjacent to the via 33 is a side surface 01, and the side surface 01 may be convex away from the via 33. The active layer 21 may include a plurality of sub-film layers 210. For example, the via 33 may pass through the sub-film layers 217 and 216; and the side surface 01 of the sub-film layers 217 and 216 may be convex away from the via 33.

In some optional embodiments, in order to further increase the contact area between the via 33 and the active layer 21, referring to FIG. 10, the side surface of the active layer 21 facing the substrate 10 is a bottom surface 02, and the angle between the tangent surface of the side surface 01 and the bottom surface 02 may gradually increase along the direction F pointing from the active layer 21 to the film layer where the source electrode 23 is located. For example, along the direction F pointing from the active layer 21 to the film layer where the source electrode 23 is located, there are tangent surfaces 031 and 032 of the side surface 01, and the angle a1 between the tangent surface 031 and the bottom surface 02 may be smaller than the angle a2 between the tangent surface 032 and the bottom surface 02. The angle between the tangent surface of the side surface 01 and the bottom surface 02 may gradually increase along the direction F pointing from the active layer 21 to the film layer where the source electrode 23 is located; and it can be understood that the diameter of the via 33 may gradually increase along the direction F pointing from the active layer 21 to the film layer where the source electrode 23 is located. Therefore, the contact area between the via 33 and the active layer may gradually increase, such that the contact area between the via 33 and the active layer 21 may be further increased. Moreover, such arrangement may reduce the difficulty of the via preparation.

Figure 12:
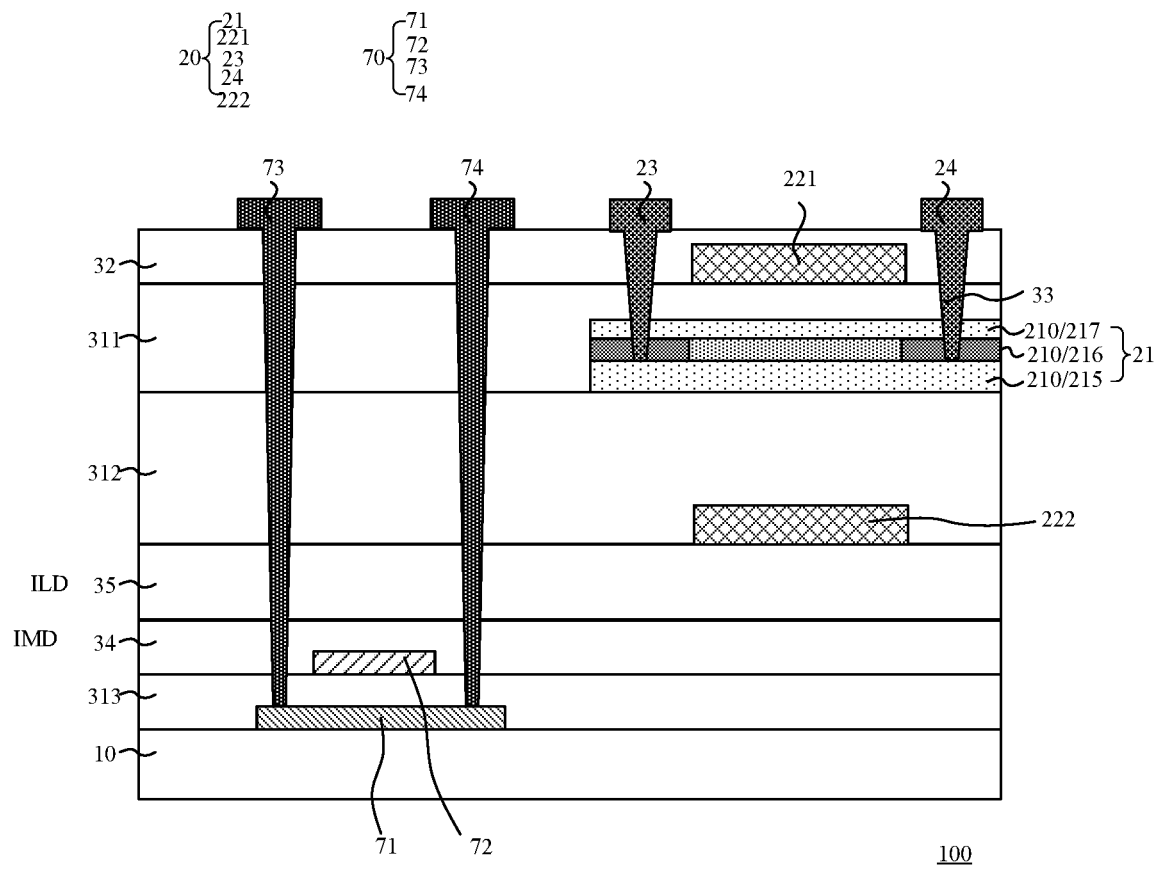
FIGS. 12-15 illustrate structural schematics of exemplary display panels according to various embodiments of the present disclosure.

In some optional embodiments, still taking that the indium ion concentration of the fifth sub-film layer 215 and the indium ion concentration of the seventh sub-film layer 217 are both less than the indium ion concentration of the sixth sub-film layer 216 as an example, furthermore, the indium ion concentration of the fifth sub-film layer 215 may be greater than the indium ion concentration of the seventh sub-film layer 217. As shown in FIG. 12, the display panel 100 may include an oxide transistor 20 and a low-temperature poly-silicon transistor 70; and the display panel 100 may also be referred to as a low-temperature polycrystalline oxide (LTPO) type display panel.

For example, the display panel 100 may further include the second gate insulation layer 312 located on the side of the active layer of the oxide transistor 20 facing the substrate 10, an interlayer dielectric layer 35 located on the side of the second gate insulation layer 312 facing the substrate 10, the second interlayer insulation layer 34 located on the side of the interlayer dielectric layer 35 facing the substrate 10, and the third gate insulation layer 313 located on the side of the second interlayer insulation layer 34 facing the substrate 10. The oxide transistor 20 may further include the second gate electrode 222; and the second gate electrode 222 may be located between the second gate insulation layer 312 and the interlayer dielectric layer 35. The low-temperature poly-silicon transistor 70 may include an active layer 71, a gate electrode 72, a source electrode 73, and a drain electrode 74. The active layer 71 may be located between the substrate and the third gate insulation layer 313; the gate electrode 72 may be located between the third gate insulation layer 313 and the second interlayer insulation layer 34; the source electrode 73 and the drain electrode 74 may be located on the side of the interlayer insulation layer 32 away from the substrate; and the source electrode 73 and the drain electrode 74 may be respectively connected to the active layer 71 through vias.

The interlayer insulation layer 32 may normally include silicon oxide (SiOx), and the second interlayer insulation layer 34 may normally include silicon nitride (SiNx). The second interlayer insulation layer 34 may contain hydrogen. If hydrogen diffuses into the active layer 20 of the oxide transistor, the active layer 20 may have a short channel effect, which may further affect the stability of the oxide transistor 20. In order to prevent the hydrogen in the second interlayer insulation layer 34 from diffusing into the active layer 20 of the oxide transistor, the thickness of the second gate insulation layer 312 may be configured to be greater than the thickness of the first gate insulation layer 311. However, since the thickness of the second gate insulation layer 312 is greater than the thickness of the first gate insulation layer 311, the carrier migration of the second gate insulation layer 312 may be relatively small, and the indium ion concentration of the fifth sub-film layer 215 may increase. Therefore, the carrier concentration of the fifth sub-film layer 215 may increase, and the problem of less carrier migration in the second gate insulation layer 312 may be improved or avoided.

Figure 13:
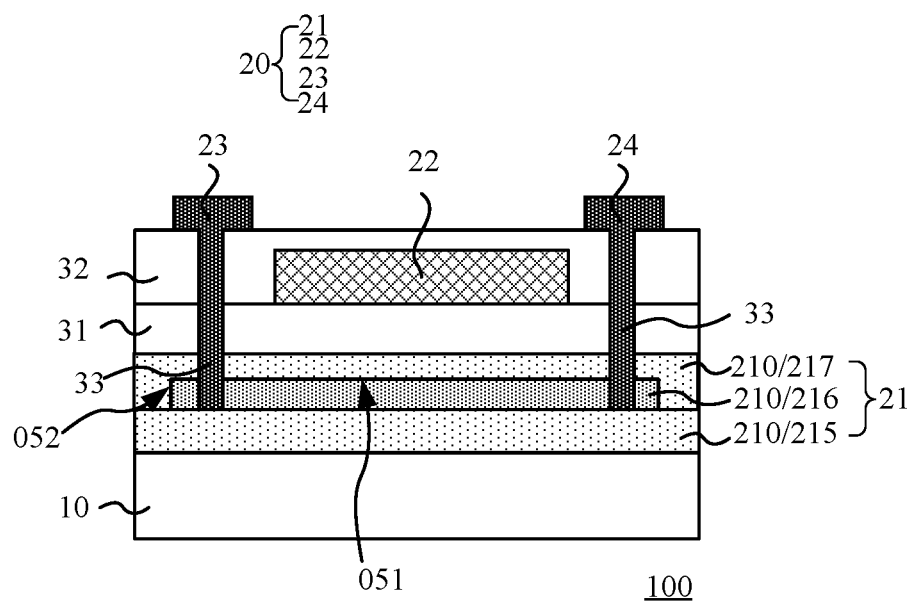
Figure 14:
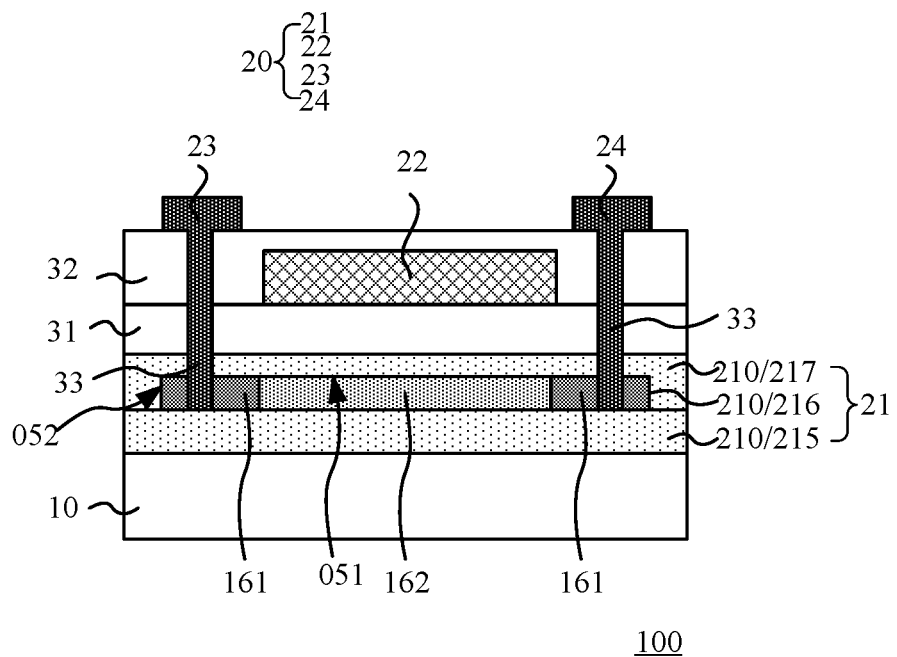
Figure 15:
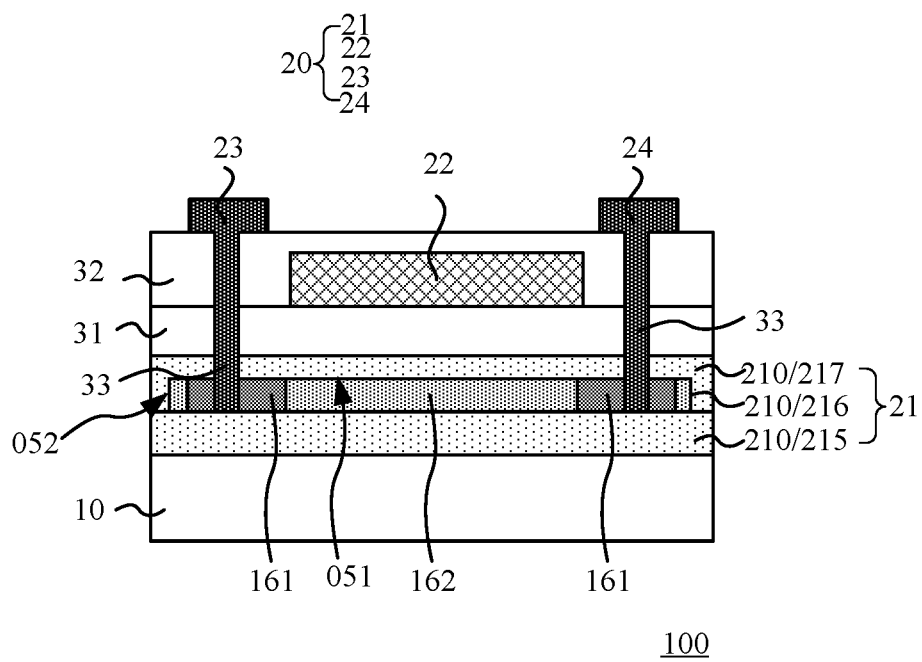

In some optional embodiments, as shown in FIGS. 13-15, still taking that the indium ion concentration of the fifth sub-film layer 215 and the indium ion concentration of the seventh sub-film layer 217 are both less than the indium ion concentration of the sixth sub-film layer 216 as an example, furthermore, the sixth sub-film layer 216 may include an upper surface 051 and a side surface 052; the upper surface 051 is a surface of the sixth sub-film layer 216 away from the substrate 10; the side surface 052 may be connected to the upper surface 051; and the seventh sub-film layer 217 may be in contact with the upper surface 051 and the side surface 052. In other words, the seventh sub-film layer 217 may cover the sixth sub-film layer 216, and the sixth sub-film layer 216 may be surrounded by the fifth sub-film layer 215 and the seventh sub-film layer 217 having relatively low indium ion concentrations. In such way, the indium of the sixth sub-film layer 216 may be better prevented from diffusing into the insulation layer around the active layer, thereby better preventing the insulation of the insulation layer from being damaged.

It can be understood that the side surface 052 herein may be away from the via 33, and the side surface 01 mentioned above may be in contact with the via 33.

In addition, when the sixth sub-film layer 216 is further divided into the source-drain adjoining region 161 and a non-adjoining region 162, and the seventh sub-film layer 217 may cover entire sixth sub-film layer 216. As shown in FIG. 14, the source-drain adjoining regions 161 may be located on two sides of the non-adjoining region 162; or as shown in FIG. 15, any source-drain adjoining region 161 may be surrounded by the non-adjoining region 162.

If hydrogen diffuses into the sub-film layers with high indium ion concentrations, the sub-film layers with high indium ion concentrations may have a short channel effect, thereby affecting the stability of the transistor. In some optional embodiments, still taking that the indium ion concentration of the fifth sub-film layer 215 and the indium ion concentration of the seventh sub-film layer 217 are both less than the indium ion concentration of the sixth sub-film layer 216 as an example, the crystallinity of the fifth sub-film layer 215 and the crystallinity of the seventh sub-film layer 217 may both be greater than the crystallinity of the sixth sub-film layer 216. Since the crystallinity of the fifth sub-film layer 215 and the seventh sub-film layer 217 are relatively large, more oxygen ions may be in the fifth sub-film layer 215 and the seventh sub-film layer 217. Oxygen ions and hydrogen ions may chemically react to generate hydroxide ions, such as $H^+ + O^{2-} \rightarrow OH^-$, which may block the damage of the sixth sub-film layer 216 by hydrogen ions.

In some optional embodiments, still taking that the indium ion concentration of the fifth sub-film layer 215 and the indium ion concentration of the seventh sub-film layer 217 are both less than the indium ion concentration of the sixth sub-film layer 216 as an example, the gallium content of the fifth sub-film layer 215 may be the highest in the fifth sub-film layer 215, the sixth sub-film layer 216, and the seventh sub-film layer 217. In such way, the electronic devices may work more stable, which is beneficial for the working stability of the oxide transistor 20.

In some optional embodiments, still taking that the indium ion concentration of the fifth sub-film layer 215 and the indium ion concentration of the seventh sub-film layer 217 are both less than the indium ion concentration of the sixth sub-film layer 216 as an example, the oxygen content of the sixth sub-film layer 216 may be the lowest in the fifth sub-film layer 215, the sixth sub-film layer 216, and the seventh sub-film layer 217. Since the oxygen content of the sixth sub-film layer 216 is the lowest, the sixth sub-film layer 216 may have more oxygen vacancies. The more the oxygen vacancies are, the greater the carrier concentration is. In such way, the carrier concentration of the sixth sub-film layer 216 may be greater, thereby improving the drive capability of the oxide transistor 20.

Figure 16:
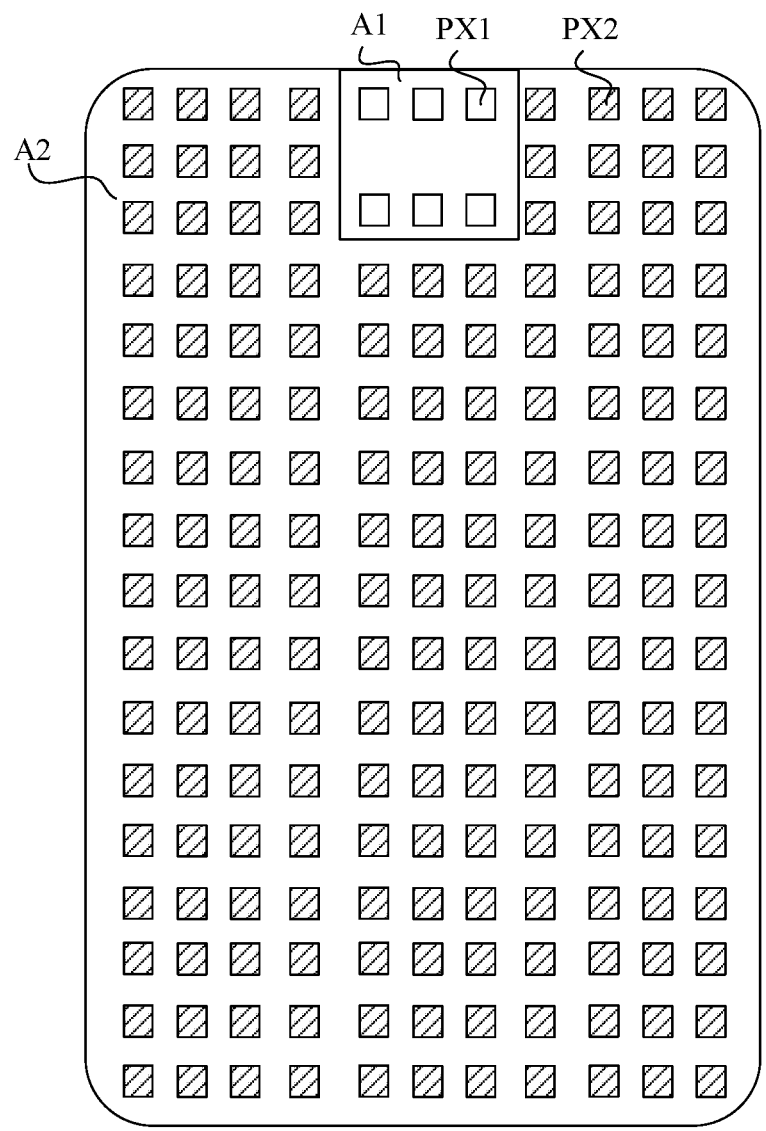
FIG. 16 illustrates another top structural view of an exemplary display panel according to various embodiments of the present disclosure.

In some optional embodiments, as shown in FIG. 16, the display panel 100 may include the first display region A1 and the second display region A2; and the pixel density (pixels per inch, PPI) of the first display region A1 may be less than or equal to the pixel density of the second display region A2. Exemplarily, the first display region A1 may be at least partially surrounded by the second display region A2. A camera may be disposed corresponding to the first display region A1, thereby forming a full-screen structure with an under-screen camera. Therefore, the light transmittance of the first display region A1 may need to be higher than the light transmittance of the second display region A2. The first display region A1 may be disposed with the first pixel drive circuit PX1, and the second display region A2 may be disposed with the second pixel drive circuit PX2. The oxide transistor 20 provided by embodiments of the present disclosure may increase the on-state current and drive capability, and the oxide transistor 20 may have higher transparency than the low-temperature poly-silicon (LTPS) transistor. Therefore, the drive transistor in the first pixel drive circuit PX1 may be the oxide transistor provided in embodiments of the present disclosure, which may increase the transmittance of the first display region and enhance the light capture capacity of the camera. Furthermore, all transistors in the first pixel drive circuit PX1 may be the oxide transistors provided in embodiments of the present disclosure. Compared with the oxide transistor, the low-temperature poly-silicon transistor may have higher mobility. Therefore, the drive transistor in the second pixel drive circuit PX may be the low-temperature poly-silicon transistor. The oxide transistor may have a lower leakage current, such that at least a part of the switch transistors in the second pixel driving circuit PX may be the oxide transistors provided in embodiments of the present disclosure, thereby ensuring the drive capability and stability of the second pixel circuit.

Figure 17:
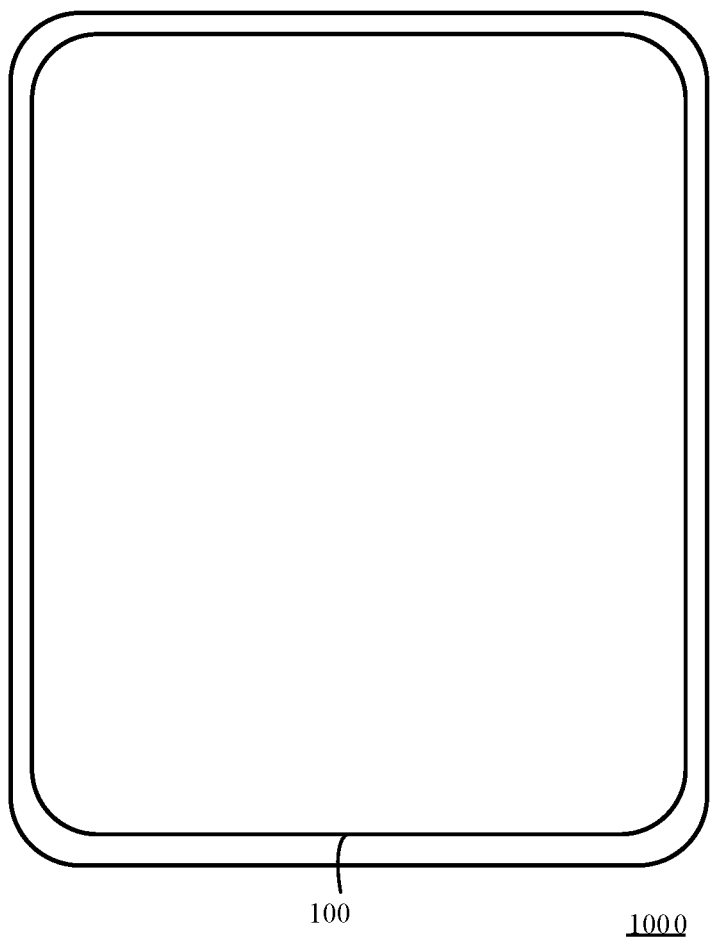
FIG. 17 illustrates a structural schematic of an exemplary display apparatus according to various embodiments of the present disclosure.

The present disclosure also provides a display apparatus, including the display panel provided in the present disclosure. Referring to FIG. 17, FIG. 17 illustrates a structural schematic of an exemplary display apparatus according to various embodiments of the present disclosure. A display apparatus 1000 provided in FIG. 17 may include the display panel 100 provided in any one of the above-mentioned embodiments of the present disclosure. The embodiments of FIG. 17 may only use a mobile phone as an example to illustrate the display apparatus 1000. It should be understood that the display apparatus provided in embodiments of the present disclosure may be a computer, a television, a vehicle-mounted display apparatus, and other display apparatus with a display function, which may not be limited in the present disclosure. The display apparatus provided by embodiments of the present disclosure may have the beneficial effects of the display panel provided by embodiments of the present disclosure, which may refer to the description of the display panel in above-mentioned embodiments and may not be described in detail according to various embodiments of the present disclosure.

From the above-mentioned embodiments, it can be seen that the display panel and the display apparatus provided by the present disclosure may achieve at least the following beneficial effects.

According to the display panel provided by embodiments of the present disclosure, the active layer of the oxide transistor may not be limited to be configured as a single film layer containing only one indium ion concentration. Instead, the active layer of the oxide transistor may be divided into the plurality of sub-film layers stacked with each other, and at least two sub-film layers may have different indium ion concentrations. Compared with the single film layer containing only one indium ion concentration in the active layer, the overall thickness of the active layer may be increased while the total content of indium contained in the active layer remains unchanged. In other words, in the case that the active layer may be prevented from being completely conductive and the oxide transistor may be ensured to have high mobility, the overall thickness of the active layer may be increased by dividing the active layer into sub-film layers with different indium ion concentrations. Therefore, it may prevent the etched vias connecting the source electrode and the drain electrode with the active layer from passing through the active layer, thereby avoiding the NG problem in the oxide transistor and improving the yield of the display panel.

According to the above-mentioned embodiments of the present disclosure, these embodiments may not describe all details, and the present disclosure may not only be limited to described embodiments. Obviously, various modifications and changes may be made according to the above-mentioned description. These embodiments may be selected and described in the specification in order to better explain the principles and practical applications of the present disclosure, such that those skilled in the art may use the present disclosure and the modification based on the present disclosure. The present disclosure may merely be limited by the claims and their full scope and equivalents.

What is claimed is:

1. A display panel, comprising:
a substrate; and
an oxide transistor, disposed on a side of the substrate, wherein:
the oxide transistor includes an active layer; the active layer includes a plurality of sub-film layers which are stacked with each other; and at least two of the plurality of sub-film layers have different indium ion concentrations with respect to each other;
the active layer includes three sub-film layers; and the three sub-film layers are a fifth sub-film layer, a sixth sub-film layer, and a seventh sub-film layer, respectively;
the sixth sub-film layer is on a side of the fifth sub-film layer away from the substrate, and the seventh sub-film layer is on a side of the sixth sub-film layer away from the substrate;
both an indium ion concentration of the fifth sub-film layer and an indium ion concentration of the seventh sub-film layer are less than an indium ion concentration of the sixth sub-film layer;
the sixth sub-film layer includes an upper surface and a side surface; the upper surface is a surface of the sixth sub-film layer away from the substrate; the side surface is connected to the upper surface; and the seventh sub-film layer is in contact with the side surface of the sixth sub-film layer from a side facing the side surface; and
the side surface is a side surface of the sixth sub-film layer away from a center of the sixth sub-film layer; and the sixth sub-film layer is surrounded by the fifth sub-film layer and the seventh sub-film layer.

2. The display panel according to claim 1, wherein:
along a direction away from the substrate, the plurality of sub-film layers is arranged by alternating high and low indium ion concentrations, or the plurality of sub-film layers is arranged by alternating low and high indium ion concentrations.

3. The display panel according to claim 1, wherein:
both a thickness of the fifth sub-film layer and a thickness of the sixth sub-film layer are greater than a thickness of the seventh sub-film layer.

4. The display panel according to claim 3, wherein:
the thickness of the fifth sub-film layer is less than 100 angstroms, the thickness of the sixth sub-film layer is less than 50 angstroms, and the thickness of the seventh sub-film layer is between 10 angstroms and 30 angstroms.

5. The display panel according to claim 1, wherein:
the indium ion concentration of the fifth sub-film layer is greater than the indium ion concentration of the seventh sub-film layer.

6. The display panel according to claim 1, wherein:
the oxide transistor further includes a gate electrode, a source electrode, and a drain electrode, and the source electrode and the drain electrode are respectively connected to the active layer through vias;
the display panel further includes a gate insulation layer and an interlayer insulation layer;
the gate insulation layer is on a side of the active layer away from the substrate; the gate electrode is on a side of the gate insulation layer away from the substrate; the interlayer insulation layer covers the gate electrode; and the source electrode and the drain electrode are on a side of the interlayer insulation layer away from the substrate; and
the vias pass through the seventh sub-film layer and the sixth sub-film layer and extend to the fifth sub-film layer.

7. The display panel according to claim 1, wherein:
both a crystallinity of the fifth sub-film layer and a crystallinity of the seventh sub-film layer are greater than a crystallinity of the sixth sub-film layer.

8. The display panel according to claim 1, wherein:
the oxide transistor further includes a first gate electrode, a source electrode, and a drain electrode;
the display panel includes a first gate insulation layer and an interlayer insulation layer;
the first gate insulation layer is on a side of the active layer away from the substrate; the first gate electrode is on a side of the first gate insulation layer away from the substrate; the interlayer insulation layer covers the first gate electrode; the source electrode and the drain electrode are on a side of the interlayer insulation layer away from the substrate; and
the source electrode and the drain electrode are respectively connected to the active layer through respective vias; and a diameter of a via of the respective vias is $\ominus$, wherein 2 µm≤$\ominus$≤3 µm.

9. The display panel according to claim 1, wherein:
the sixth sub-film layer includes a source-drain adjoining region and a remaining non-adjoining region.

10. The display panel according to claim 9, wherein:
the display panel includes a capacitor; and a plate of the capacitor is disposed in a same layer and made of a same material as the source-drain adjoining region.

11. The display panel according to claim 1, wherein:
the display panel includes a capacitor; and a plate of the capacitor is disposed in a same layer and made of a same material as a sub-film layer with a high indium ion concentration in the plurality of sub-film layers.

12. The display panel according to claim 1, wherein:
in the fifth sub-film layer, the sixth sub-film layer and the seventh sub-film layer, the fifth sub-film layer has a highest gallium content; or
in the fifth sub-film layer, the sixth sub-film layer and the seventh sub-film layer, the sixth sub-film layer has a lowest oxygen content.

13. The display panel according to claim 1, wherein:
the display panel includes a first display region and a second display region; a pixel density of the first display region is less than or equal to a pixel density of the second display region; the first display region is disposed with a first pixel drive circuit; and the second display region is disposed with a second pixel drive circuit; and
a drive transistor in the first pixel drive circuit is the oxide transistor; a drive transistor in the second pixel drive circuit is a low-temperature poly-silicon transistor; and at least a part of switch transistors in the second pixel drive circuit are oxide transistors.

14. The display panel according to claim 1, wherein:
a first sub-film layer of the plurality of sub-film layers is made of a material including indium gallium zinc oxide.

15. The display panel according to claim 1, wherein the oxide transistor further includes a source electrode and a drain electrode, and the source electrode and the drain electrode pass through the seventh sub-film layer and the sixth sub-film layer and reach a top surface of the fifth sub-film layer that has a lower indium ion concentration than the sixth sub-film layer.

* * * * *